(12) United States Patent
Afsahi

(10) Patent No.: US 9,252,723 B2
(45) Date of Patent: Feb. 2, 2016

(54) DISTRIBUTED QUALITY FACTOR ADJUSTMENT

(71) Applicant: Broadcom Corporation, Irvine, CA (US)

(72) Inventor: Ali Afsahi, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 15 days.

(21) Appl. No.: 14/101,722

(22) Filed: Dec. 10, 2013

(65) Prior Publication Data

US 2015/0109059 A1   Apr. 23, 2015

Related U.S. Application Data

(60) Provisional application No. 61/894,010, filed on Oct. 22, 2013.

(51) Int. Cl.

| | |
|---|---|
| *H03F 1/56* | (2006.01) |
| *H03F 3/21* | (2006.01) |
| *H03F 1/22* | (2006.01) |
| *H03F 3/195* | (2006.01) |
| *H03F 3/24* | (2006.01) |
| *H03F 3/45* | (2006.01) |

(52) U.S. Cl.
CPC ............. *H03F 1/565* (2013.01); *H03F 1/223* (2013.01); *H03F 3/195* (2013.01); *H03F 3/21* (2013.01); *H03F 3/245* (2013.01); *H03F 3/45179* (2013.01); *H03F 2203/45506* (2013.01); *H03F 2203/45644* (2013.01)

(58) Field of Classification Search
CPC ....... H03H 7/42; H03F 1/565; H03F 3/45165; H03F 3/45264; H03F 3/45363; H03F 3/45461; H03F 2200/06; H03F 2200/09; H03F 2200/273; H03F 2203/45141; H03F 2203/45176; H03F 2203/45316; H03F 2203/45318; H03F 2203/45614; H03F 2203/45034; H03F 2203/45724
USPC ........ 333/25, 24, 169; 330/301, 66, 116, 117, 330/144, 169, 182, 275; 334/11; 336/155, 336/182; 343/749, 850
See application file for complete search history.

(56) References Cited

U.S. PATENT DOCUMENTS 7,973,603 B2 *   7/2011   Kammula et al. ............ 330/284
8,035,458 B2 *  10/2011   Frye et al. ...................... 333/25

* cited by examiner

*Primary Examiner* — Steven J Mottola
*Assistant Examiner* — Hafizur Rahman
(74) *Attorney, Agent, or Firm* — Brinks Gilson & Lione

(57) ABSTRACT

A system includes a differential circuit, multiple cross-coupled transconductance circuits. In some implementations, the differential circuit may include an inductor coil in a balun or transformer. The cross-coupled transconductance circuits may act to reduce the internal resistance of the differential circuit to increase the quality factor of the differential circuit. The cross-coupled transconductance circuit may be connected at differential points along the differential circuit and be engaged and disengaged to linearize the quality factor of the differential circuit.

20 Claims, 7 Drawing Sheets

US 9,252,723 B2

DISTRIBUTED QUALITY FACTOR ADJUSTMENT

PRIORITY CLAIM

This application claims priority to U.S. Provisional Application Ser. No. 61/894,010, filed Oct. 22, 2013, which is incorporated herein by reference in its entirety.

TECHNICAL FIELD

This disclosure relates to quality factor adjustment in differential circuits.

BACKGROUND

Baluns may accept a differential input and produce a single-ended output. In some cases, power amplifiers may produce a differential output for use with an antenna that may accept single-ended inputs. A balun may be used to convert the signals between the power amplifier and antenna. Baluns and other circuits using differential inductors may be formed on integrated circuits. In some cases, a signal may experience power loss while traversing the differential inductors. Flexible balun solutions that are robust to power loss may be desirable.

DETAILED DESCRIPTION

The disclosure below concerns techniques and architectures for increasing the quality factor (Q) of a differential inductor, e.g. a differential inductor in a balun. In some implementations, the techniques and architectures may facilitate the Q increase via distributed cross-coupled transconductance circuits (CCTCs), which may be connected at differential voltage point pairs within the differential inductor. The distributed CCTCs may allow for adjustment of the resistivity between the differential point pairs. The distributed CCTCs may be individually activated and deactivated to change the resistivity of the differential point pair. The resistivity adjustment may change the Q of the differential inductor. Additionally or alternatively, the distributed CCTCs may be tunable, e.g., have adjustable transconductance, to allow for fine adjustment of the resistivity between voltage point pairs.

Figure 1:
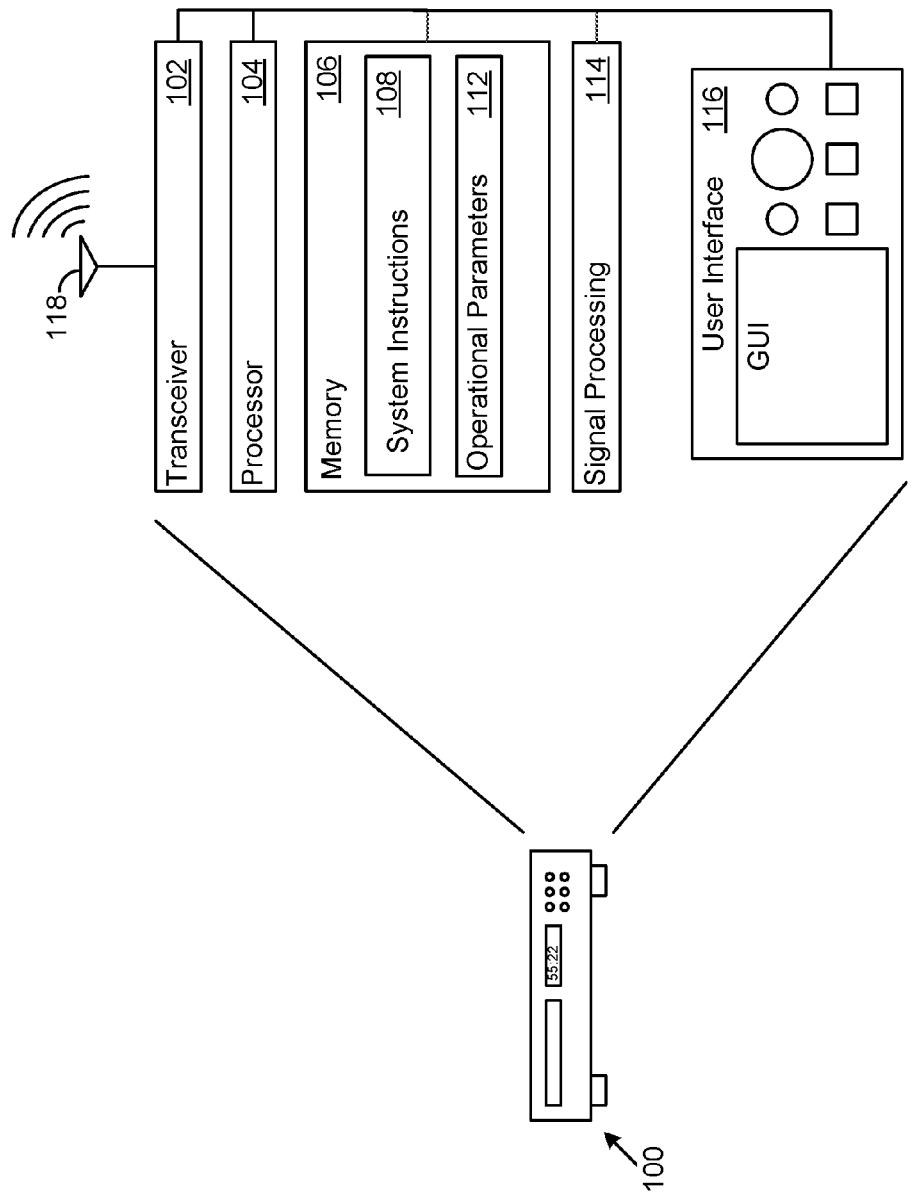
FIG. 1 shows an example device.

The example device described below provides an example context for explaining the techniques and architectures to support Q adjustment in differential circuits. FIG. 1 shows an example device 100. In one example, the device may be a communication device, such as a cable or satellite television set-top box (STB), or cellular telephone. However, the device may be virtually any device implementing internal or external signaling. For example, a portable gaming system, satellite navigation system, or tablet computer may use such differential inductor circuits. The communication device may include a user interface 116 to allow for user operation of the device.

The device 100 may include transceiver elements 102 to support RF communication, and one or more processors 104 to support execution of applications and operating systems, and to govern operation of the device. The device 100 may include memory 106 for execution support and storage of system instructions 108 and operational parameters 112. Signal processing hardware 114 (e.g., an Analog to Digital Converter (ADC), baseband processors or other signal processing circuits.) may also be included to support transmission and reception of signals. The signal processing hardware 114 may further include amplifiers to adjust input signal levels to useable output levels. For example, a power amplifier (PA) may amplify a signal to a level for transmission over a given distance or through an environment with interference and distortion sources. In some cases, the PA may be driven differentially and may be paired with the antenna 118 that accepts single-ended inputs. A balun that includes one or more differential inductors may convert the PA output to a single-ended signal.

Figure 2:
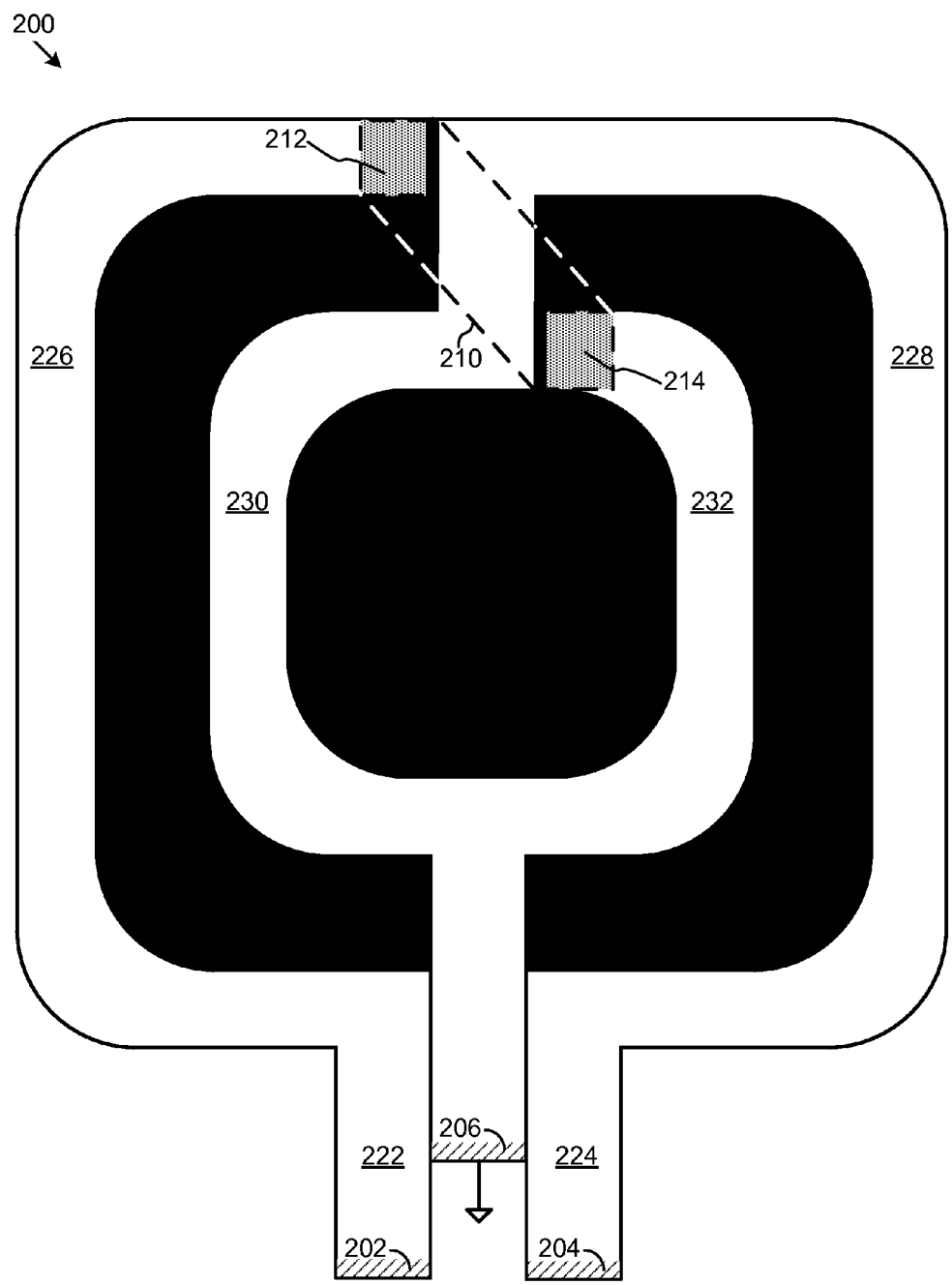
FIG. 2 shows an example differential inductor.

FIG. 2 shows an example differential inductor 200. The example differential inductor 200 includes ports 202, 204, which form a differential connection, and a virtual ground port 206. The differential inductor 200 includes a path from port 202 to port 204 with the virtual ground port 206 located at or near the middle of the differential inductor 200. The jumper 210 connects points 212 and 214. For example, the jumper 210 may include a connecting path on a second plane of an integrated circuit. A differential signal may be applied to ports 202 and 204. In various implementations, the virtual ground may include a ground port, a fixed voltage point, e.g. a supply voltage, a floating direct current (DC) point, and/or an alternating current (AC) ground. In some implementations, the virtual ground 206 may allow a DC signal and/or a slowly varying DC signal to be present. The virtual ground may not allow an AC signal and/or differential signal to be present.

Progressing into inner portions the differential inductor 200 produces smaller differential signals across points 222, 224, 226, 228, 230, 232 on the differential inductor 200. The points 222, 224, 226, 228, 230, 232 may form equidistant differential pairs from the virtual ground port 206 of the differential circuit 200. For example, if ports 202 and 204 are driven differentially, the signal at point 226 may be inverted with respect to the signal at point 228. In some cases, the average amplitude may be the same or similar at points 226 and 228. The voltage swing between points 226 and 228 may be less than the swing between points 222 and 224. In some cases, the voltage swing between points 226 and 228 may be greater than the swing between points 230 and 232. At the virtual ground port no differential signal may be present.

In various implementations, the differential inductor 200 may be inter-wound with a second inductive circuit to form a transformer. For example, the second inductive circuit may occupy open spaces between the inner and outer rings of the differential inductor 200. The proximity of the inductor coils may affect the strength of their interaction. In some cases, distributed CCTCs, as discussed below, may be connected to the inter-wound inductors to adjust their individual Qs.

In some implementations, the differential inductor 200 may be an integrated or on-chip circuit. The integrated circuit implementation may include planar sections that form the structure of the inductor. In other words, much of the inductor structure may be two dimensional. The jumper may be implemented via multilayer processing. In some cases, integrated or on-chip inductors may be associated with reduced Q. Techniques for Q adjustment, such as those discussed below, may be applied to mitigate Q reductions.

In other implementations, the differential inductor 200 may be an off-chip component. In those cases, the inductor may include a wire winding or other design that leverages the three dimensional construction possibilities afforded by off-chip designs.

Figure 3:
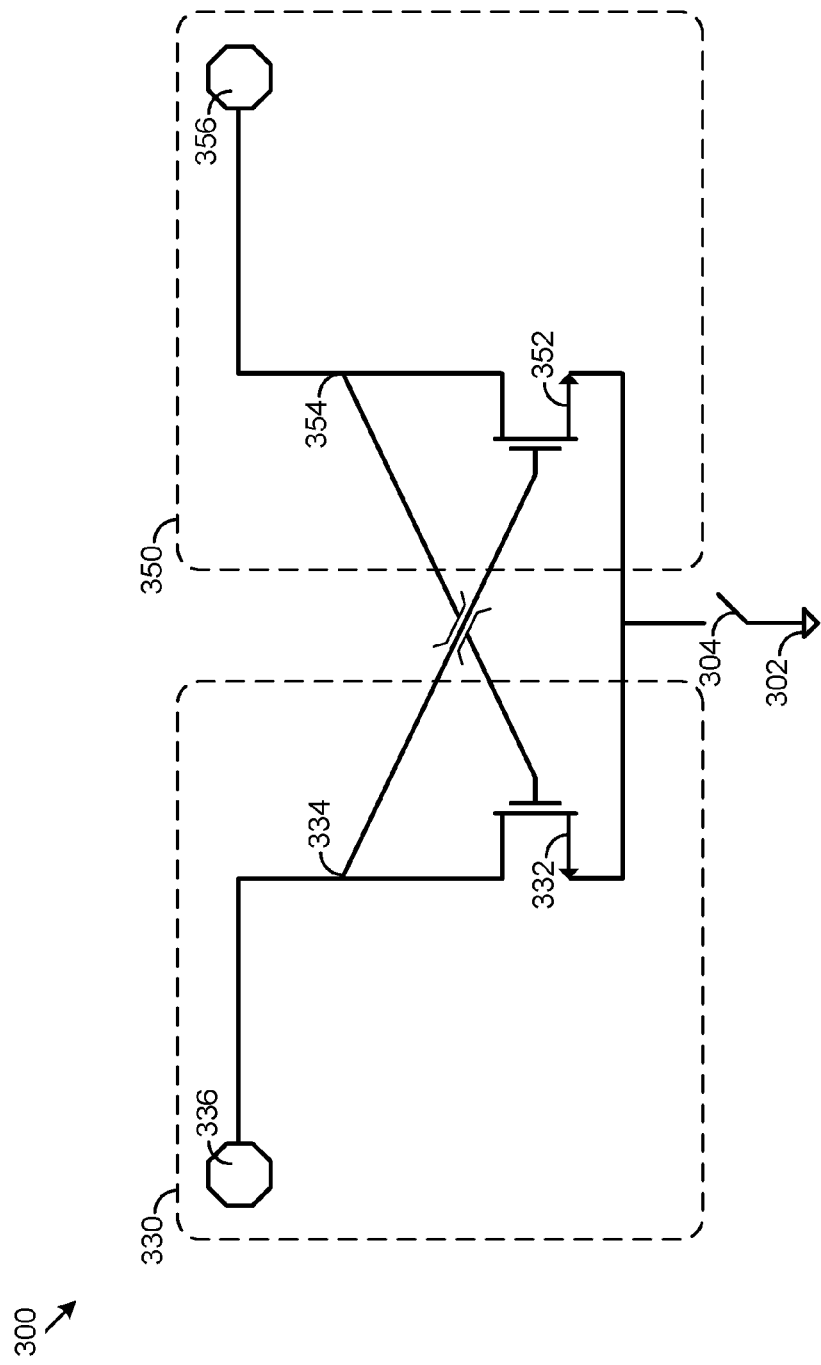
FIG. 3 shows an example cross-coupled transconductance circuit.

FIG. 3 shows an example CCTC 300. In some cases, CCTCs may cancel effects of a positive impedance, and may be considered to have a negative resistance for some classes of incident signals. For example, for a differential signal at connection ports 336 and 356, the CCTC 300 may have a negative sloping current—voltage response. Increasing the current incident on the port 336 may reduce the voltage at port 336 when a signal opposite in polarity is present at port 356. The CCTC 300 has a virtual ground connection 302 connected via a switch 304 to paths 330 and 350. Path 330 includes transistor 332, junction 334, and port 336. Path 350 includes transistor 352, junction 354, and port 356. The ports may 336 and 356 may be connected to place the CCTC 300 in parallel with a circuit containing a positive impedance. In this configuration CCTC may cancel or reduce effects of the positive impedance. For example, the CCTC 300 may be connected at points along the differential inductor 200 to adjust the Q of the differential inductor 200 by reducing its internal resistance. Junction 334 may be connected to the gate of transistor 352, and junction 354 may be connected to the gate of transistor 332. Transistors 332 and 352 may be field-effect transistors (FETs) and/or bipolar junction transistors (BJT). In some implementations, transistors 332 and 352 may be negative metal oxide semiconductor (nMOS) or negative-positive-negative (npn) junction transistors. In various implementations, positive metal oxide semiconductor (pMOS) or positive-negative-positive (pnp) bi-polar junction transistors. In some cases, the complement circuit to CCTC 300 may be used when pMOS and/or pnp transistors are used, e.g. virtual ground 302 may include a supply voltage in place of a ground.

In various implementations, the transistors 332 and 352 may include sets of parallel unitary transistors, and each of the unitary transistors may be referred to as a finger. The fingers may be independently switchable by control logic and/or external inputs to allow for adjustment of the transconductance supplied by the CCTC 300. The fingers may include FETs, BJTs and/or a combination. In some implementations, matching sets of fingers may be used to construct transistors 332 and 352. For example, the number of FET fingers in transistor 332 may be the same as the number of FET fingers in transistor 352, and the number of BJT fingers in transistor 332 may be the same as the number of BJT fingers in transistor 352.

The CCTC 300 may include integrated components, e.g. complementary metal oxide semi-conductor (CMOS) components. In some implementations, the CCTC may be disposed within open space within a coil. For example, the open spaces within the differential inductor 200. In some cases, discrete components, e.g. macroscopic components, may be used to construct the CCTC 300.

In some implementations, the CCTC 300 may act as a negative resistor across ports 336 and 356. The CCTC 300 may cancel effects of a parallel positive impedance between ports 336 and 356. For example, when the signal at port 336 is high, junction 334 may be high, and the gate of transistor 352 may be high. Current may be passed to virtual ground 302 to port 356. For a voltage at port 336, a voltage drop between ports 336 and 356 associated with a positive impedance parallel to the CCTC 300 may be partially cancelled. Because, a small signal at 336 may be used to gate a larger signal at port 356. For a voltage at port 356, a similar positive impedance cancellation may be observed.

In various implementations, the CCTC 300 may be act as a negative resistor for a differential signal across ports 336 and 356. For a differential signal incident on ports 336 and 356, the signal present on the gates of transistors 332 and 352 may be opposite, because the gate of transistor 332 is coupled to port 356 and the gate of transistor 352 is coupled to port 336. The opposing polarity of the signals may cause one of transistors 332 and 352 to allow signal to flow, and the other of transistors 332 and 352 to not allow signal to flow. For example, a high signal on port 336 may be paired with a low signal on port 356 to form a differential pair. The high signal at 336 may open the gate of 352 and allow signal to flow to port 356. The low signal at 356 may close the gate of 332 and not allow signal to flow to port 336. For a common signal on ports 336 and 356 gates of transistors 332 and 352 may allow signal to flow. If 336 and 356 are high, signal may not flow from virtual ground 302 to the ports 336, 356. Power consumption may occur and CCTC 300 may not act as a negative resistor for common signals on 336 and 356. Signals may be decomposed into differential and common signal components. The effective negative resistance of CCTC 300 for a given signal may be proportional to the ratio of the differential and common components of the signal. In a given device, the ports 336 and 356 may have a resistance between them. The effective negative resistance between supplied by CCTC 300 reduces the effective resistance between ports 336 and 356.

In various implementations virtual ground 302 may be at a different potential from virtual ground 206. Current may flow from virtual ground 206 to virtual ground 302 via ports 336 and 356 during operation of the CCTC 300. For a complement CCTC 300, current may flow from virtual ground 302 to virtual ground 206.

In some cases, CCTC 300 may have a nonlinear response to varying differential signal swings. For example, for a small amplitude signal swing between differential points a large effective transconductance may be supplied by the CCTC 300. For a large amplitude signal swing between the differential points, a small effective transconductance may be supplied by the CCTC 300. In some cases, the change in effective transconductance may alter the negative resistance of the CCTC 300. The Q of the differential inductor may change as the negative resistance changes. The changing Q may affect the performance of the differential inductor. For example, in a balun, losses may increase with an increasing amplitude signal swing. In some cases, for large amplitude swings, the Q of the CCTC and differential circuit may be low. A large current may be consumed to reach a Q that may support linear performance of the differential circuit across large and small amplitude swings.

Control logic or external signals may engage and/or disengage CCTCs 300 via operation of switch 304. If switch 304 is engaged, current may flow from virtual ground to ports 336 or 356. If switch 304 is disengaged current may not flow from virtual ground, and no current may flow across the CCTC 300. In various implementations the switch 304 may be implemented as a cascode transistor. Additionally or alternatively, CCTCs 300 may be partially or fully engaged or disengaged via switchable finger elements included in transistors 332 and 352. As discussed above, the finger elements allow for adjustment of the transconductance supplied by the CCTC 300. The transconductance may be adjusted to zero, e.g., all fingers disengaged, to fully disengage the CCTC 300. In various implementations, the switching the finger elements and/or switch 304 may be controlled via logic within the CCTC 300 or via control ports for external input.

Figure 4:
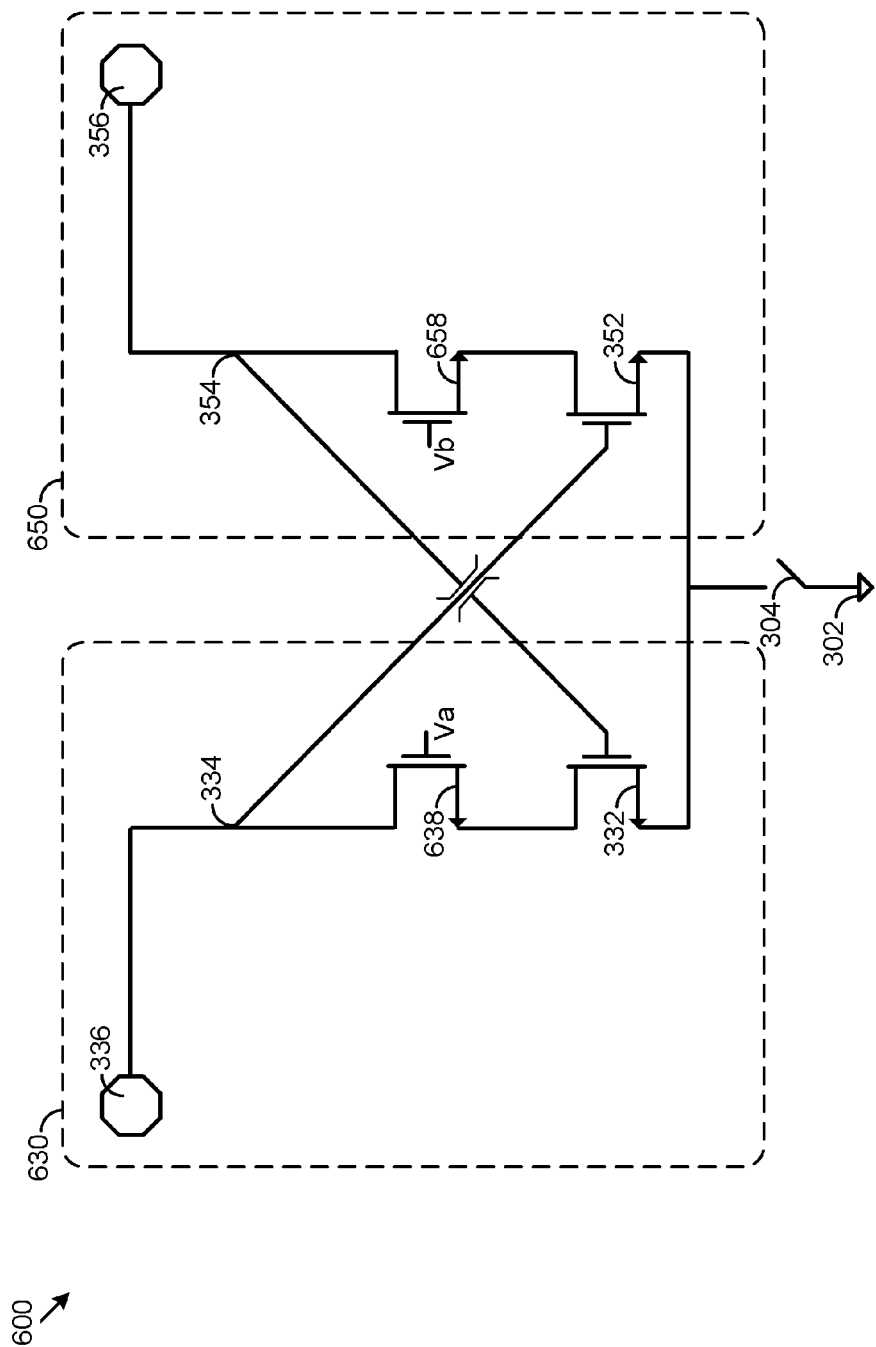
FIG. 4 shows an example cross-coupled transconductance circuit.
Figure 5:
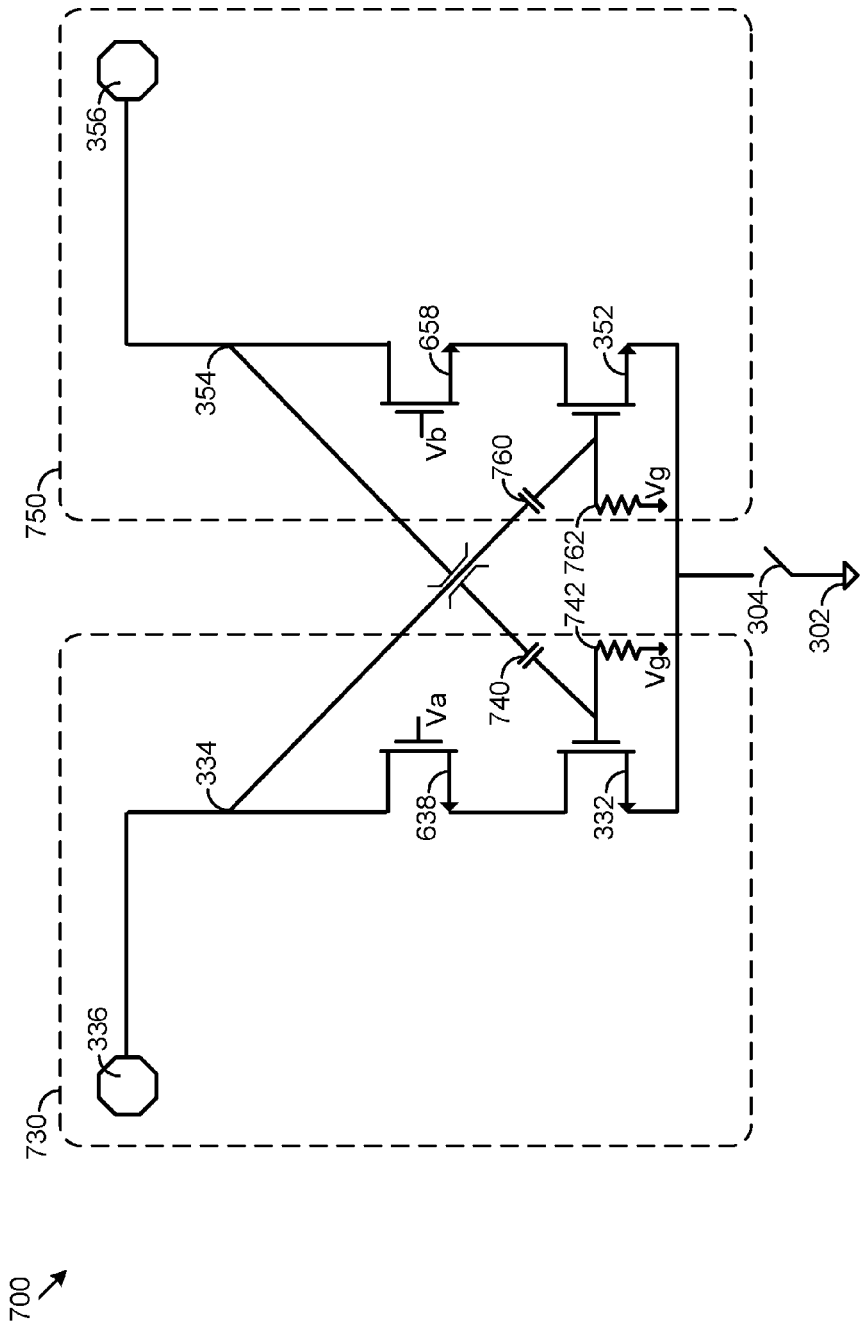
FIG. 5 shows an example cross-coupled transconductance circuit.

FIG. 4 shows an example CCTC 600. The example CCTC 600 includes paths 630, 650 which have cascode transistors 638, 658. The drains of cascode transistors 638, 658 may be connected to junctions 334, 354. The drain of cascode resistor 638 may be tied to the gate of transistor 352, and the drain of cascode resistor 658 may be tied to the gate of transistor 332. Cascode transistors 638, 658 accept control signals Va, Vb at their gates. In various implementations control signals Va and Vb may be the same signal. Control signals Va, Vb may be set high to engage cascode transistors 638, 658. When cascode transistors 638, 658 are engaged CCTC 600 may be active. Control signals Va, Vb may be set low to disengage cascode transistors 638, 658. When cascode transistors 638, 658 are engaged CCTC 600 may be inactive. In various implementations, control signals Va, Vb may be different. For example, setting one or Va or Vb high and the other low may allow for unidirectional operation of the CCTC.

FIG. 4 shows an example CCTC 700. The example CCTC 700 includes paths 730, 750 which capacitors 740, 760 and resistors 742, 762. The resistors 742, 762 may have a connection to a point held at potential Vg. The capacitors 740, 760 and resistors 742, 762 may allow the gates of transistors 332, 352 to be biased independently of junctions 334, 354 which are connected to the drains of cascode transistors 638, 658. The bias of the gates of transistors 332, 352 may be set by adjusting Vg.

A CCTC is an example negative resistance circuit. In various implementations other negative resistance circuits may be used to cancel a positive resistive between connection ports. For example tunnel diodes, amplifiers, operational amplifier circuits, and/or other negative resistance circuits may be implemented.

Figure 6:
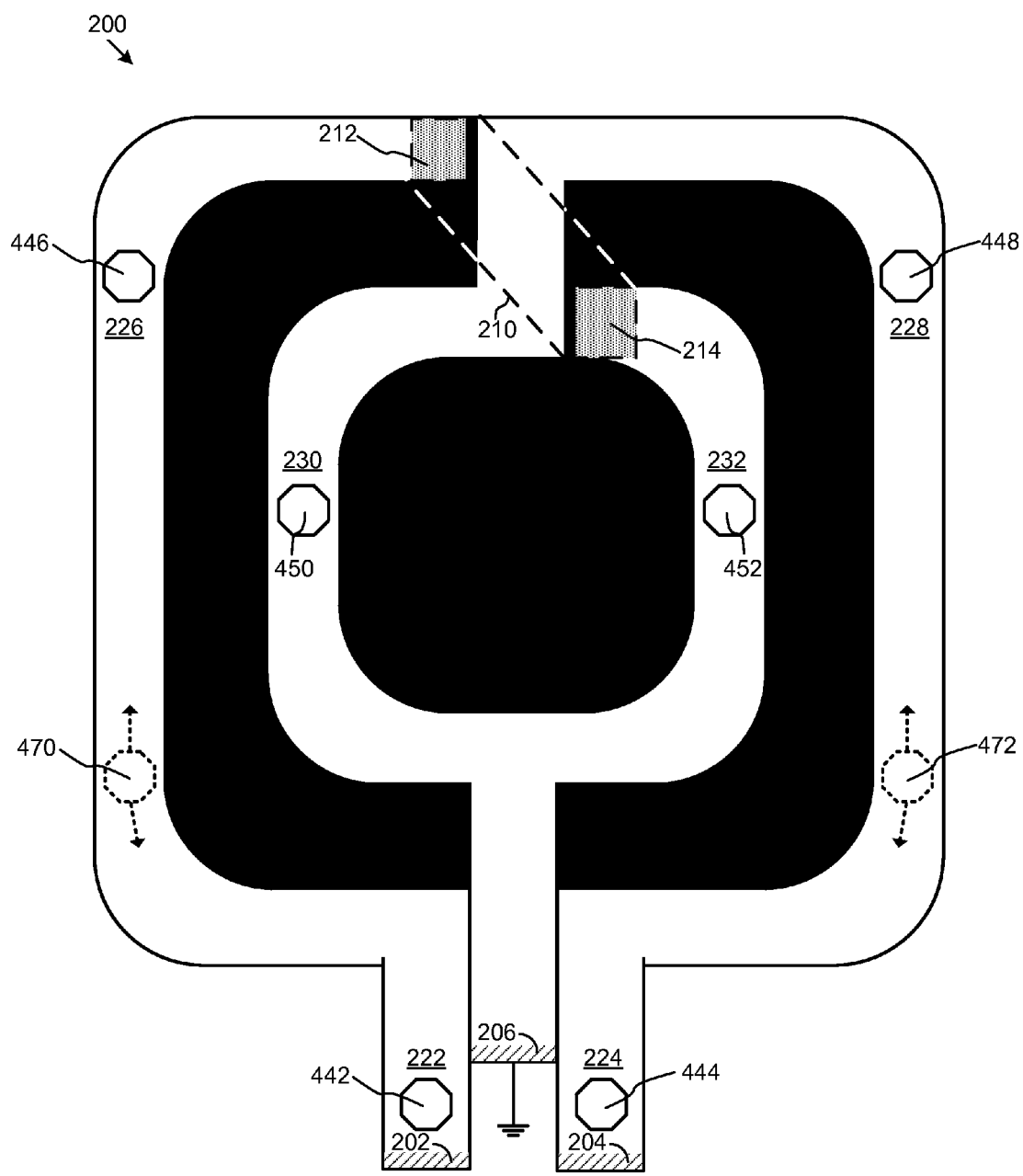
FIG. 6 shows an example differential inductor.

FIG. 6 shows an example differential inductor 200. The example differential inductor 200 may include connection ports 442, 444, 446, 448, 450, 452 at symmetric points 222, 224, 226, 228, 230, 232. In various implementations symmetric points 222, 224, 226, 228, 230, 232 may form differential signal pairs. CCTCs 300 may be connected across the differential pairs, e.g. points 222 and 224, 226 and 228, and 230 and 232 via the port connections 442, 444, 446, 448, 450, 452 to provide negative resistance. The negative resistance across the differential pairs may increase the Q of the differential inductor 200 by reducing the effective resistance across the differential pairs. As discussed above, the signal swing within a differential inductor may decrease in amplitude as one progresses from ports, 202, 204, to the virtual ground port 206. The signal swing amplitude may be large at ports 442 and 444, medium at ports 446 and 448, and small at ports 450 and 452.

In some implementations, CCTCs, e.g. 300, 600, 700, may be connected in a distributed fashion across the ports. For example, distributed CCTCs may be connected across the ports and engaged and disengaged as the signal swing varies. When the signal swing is small a CCTC across ports 442 and 444 may be engaged and CCTCs across ports 446 and 448, and 450 and 452 may be disengaged. When the signal swing is at a medium value, the CCTC 300 across ports 446 and 448 may be engaged and CCTCs across ports 442 and 444, and 450 and 452 may be disengaged. When the signal swing is at a large value, the CCTC across ports 450 and 452 may be engaged and CCTCs across ports 442 and 444, and 446 and 448 may be disengaged. The negative resistance supplied by the CCTCs may be stable because as the signal swing amplitude changes, the ports with the engaged CCTC across them may also change. For increasing signal swings incident at differential ports 202, 204, ports which may experience decreasing amplitude swings have a CCTC engaged. In this manner, the signal swing experienced by the engaged CCTC may be stabilized.

Ports 442, 444, 446, 448, 450, 452 are example ports. In various implementations ports may be added or removed. For example, ports 470 and 472 may be added and positioned at varying points along the differential inductor. In some implementations, connection ports for CCTCs may coincide with differential ports 202, 204. Additionally or alternatively, a CCTC may be connected across non-differential combinations of ports. For example, a CCTC may be connected across ports 446 and 452. To determine the effective negative resistance supplied by a CCTC across ports 446 and 452 the signal may be decomposed into differential and common components.

Additionally or alternatively, the Q of the differential inductor 200 may be held stable by partially or fully disengaging finger elements of the transistors 332 and 352. For example, as the signal swing incident on ports 202 and 204 grows from small to medium, a CCTC across ports 442 and 444 may be increasingly disengaged, and a CCTC across ports 446 and 448 may be increasingly engaged.

In some implementations, a CCTC across ports 442 and 444 and other CCTCs may not be present. The CCTC across ports 442 and 444 may be partially disengaged for small signal swings incident on differential ports 202 and 204. As the signal swing grows in amplitude, more fingers may be engaged to hold the effective transconductance supplied by the CCTC across port 442 and 444 stable. As the signal shrinks in amplitude fingers may be disengaged to hold the effective transconductance stable. The fingers may experience a non-linear response as the signal swing grows in amplitude. The number of fingers engaged may grow non-linearly with the signal swing to compensate for the non-linear response of the individual fingers.

By switching, an increasing incident signal swing across ports 202 and 204 may be handled by a CCTC connected at points progressively closer to the virtual ground port 206 and/or by an increasing number of finger elements. This process may be referred to as switching up. A decreasing incident signal swing across ports 202 and 204 may be handled by a CCTC connected at points progressively further from the virtual ground port 206 and/or by a decreasing number of finger elements. This process may be referred to as switching down.

Additionally or alternatively, a CCTC may be connected to multiple pairs of ports. Switches may be included such that the CCTC may be engaged to a pair of ports and disengaged from other ports. The CCTC may then be switched to ports closer to the virtual ground port 206 as the signal swing incident on the differential ports 202, 204 increases.

In some implementations, signal swing amplitudes associated with small and large amplitudes may be determined based on a dynamic range or range of operation of the circuit that includes the differential inductor 200. For example, a PA may have a maximum amplification level and a minimum amplification level. A differential inductor operating in conjunction with the PA may be implemented such that small signals correspond to a range of amplification near the minimum level and large signals correspond to a range of amplification near the maximum level. For example, in a PA capable of 0-12 dB of amplification. The minimum 4 dB may be small signals, the next 4 dB may be medium signals and the maximum 4 dB may be large signals. In various implementations other number of signal levels may be used. For example, a system may use 1, 5, 25, 100, or 1000 levels. Levels may be associated with finger switching and/or disengaging/engaging CCTCs via switch 304. Additionally or alternatively, signal levels may be associated with incident signal swing amplitudes and not amplification levels.

In some cases, signal levels may overlap. For example, for an increasing signal swing amplitude a CCTC and/or finger may be switched up when a given signal level threshold is exceeded. For a decreasing signal swing amplitude the CCTC and/or finger may not be switched down when the signal level drops below the given threshold. The CCTC and/or finger may be switched down when the signal level drops below a second lower threshold. For example, a switch up may occur when a signal swing amplitude of A is detected. Switching down may occur once the signal drops below B, where B is less than A. In some cases, a signal near a signal level threshold may not undergo rapid switching up and down if the threshold is crossed repeatedly.

Figure 7:
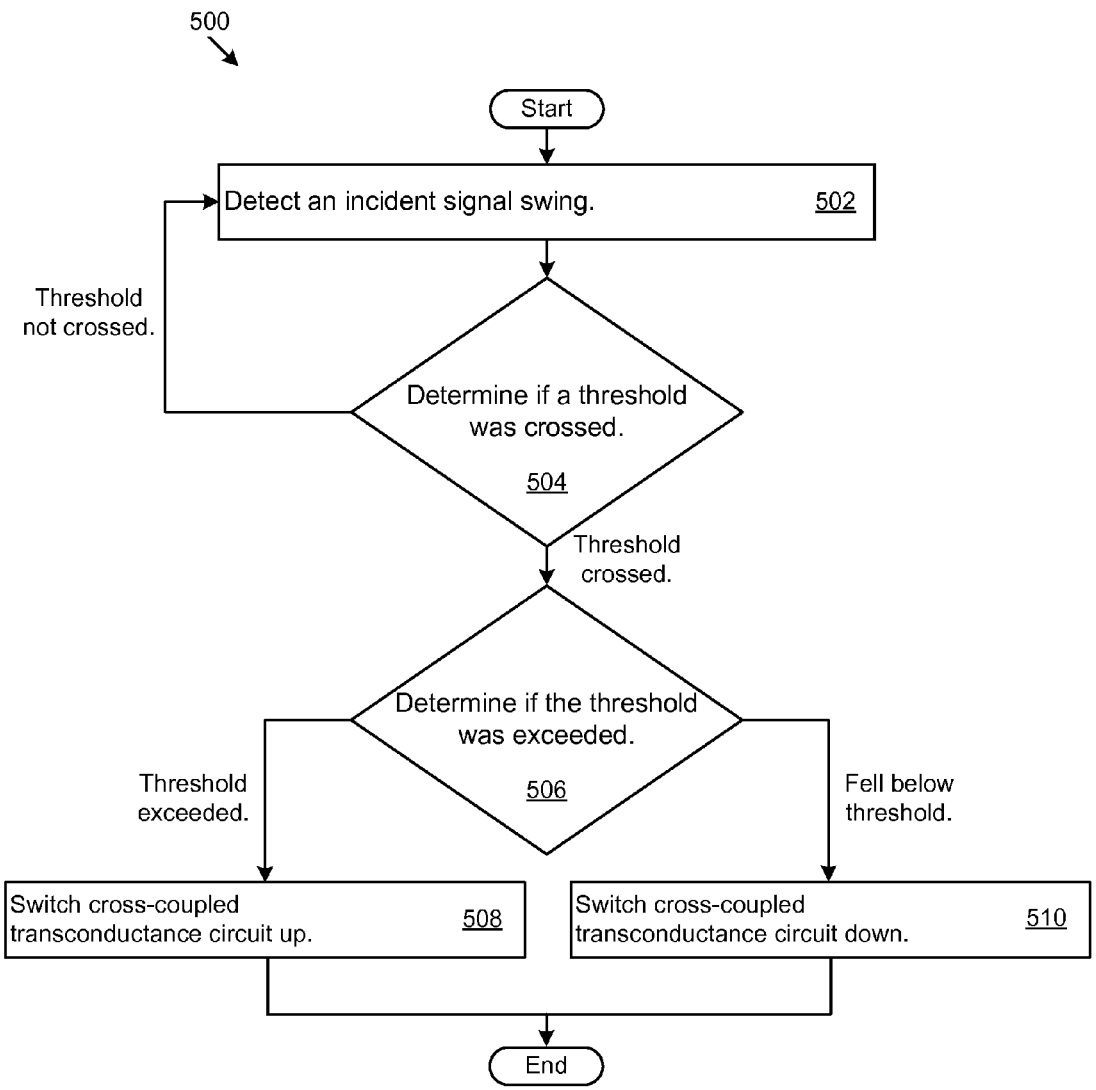
FIG. 7 shows example logic for distributed cross-coupled transconductance circuit operation in a differential circuit.

FIG. 7 shows example logic 500 for distributed CCTC operation in a differential circuit. The logic 500 may detect an incident signal swing (502). For example, the logic 500 may receive an indication of the signal swing amplitude from a sensor at ports 202 and 204 of a differential inductor 200. Additionally or alternatively, the logic may receive an indication of an amplification level from an amplifier paired with the differential inductor 200. The logic 500 may determine if a signal level threshold was crossed (504). When a signal level threshold is crossed, the logic may determine if the incident signal swing exceeded or fell below the threshold (506). If a signal level threshold was exceeded, the logic 500 may cause the CCTCs and/or finger elements to switch up (508). If the incident signal swing fell below the threshold, the logic 500 may cause the CCTCs and/or finger elements to switch down (510). For example, a CCTC and/or finger may be engaged/disengaged.

The methods, devices, and logic described above may be implemented in many different ways in many different combinations of hardware, software or both hardware and software. For example, all or parts of the system may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. All or part of the logic described above may be implemented as instructions for execution by a processor, controller, or other processing device and may be stored in a tangible or non-transitory machine-readable or computer-readable medium such as flash memory, random access memory (RAM) or read only memory (ROM), erasable programmable read only memory (EPROM) or other machine-readable medium such as a compact disc read only memory (CDROM), or magnetic or optical disk. Thus, a product, such as a computer program product, may include a storage medium and computer readable instructions stored on the medium, which when executed in an endpoint, computer system, or other device, cause the device to perform operations according to any of the description above.

The processing capability of the system may be distributed among multiple system components, such as among multiple processors and memories, optionally including multiple distributed processing systems. Parameters, databases, and other data structures may be separately stored and managed, may be incorporated into a single memory or database, may be logically and physically organized in many different ways, and may implemented in many ways, including data structures such as linked lists, hash tables, or implicit storage mechanisms. Programs may be parts (e.g., subroutines) of a single program, separate programs, distributed across several memories and processors, or implemented in many different ways, such as in a library, such as a shared library (e.g., a dynamic link library (DLL)). The DLL, for example, may store code that performs any of the system processing described above.

Various implementations have been specifically described. However, many other implementations are also possible.

What is claimed is:

1. A device, comprising:
   a differential circuit comprising:
      a first pair of ports, the first pair of ports characterized by a first resistance; and
      a second pair of ports, the second pair of ports characterized by a second resistance;
   a first transconductance circuit (TC) coupled across the first pair of ports, the first TC configured to, when engaged, reduce the first resistance; and
   a second TC coupled across the second pair of ports, the second TC configured to, when engaged, reduce the second resistance;
   control circuitry configured to:
      detect a signal incident on the differential circuit;
      determine when the signal crosses a threshold; and
      responsive to the signal crossing the threshold:
         engage the first TC; and
         disengage the second TC.

2. The device of claim 1, where the first TC comprises a first path from a virtual ground to a first port of the first pair of ports, the first path comprising a first transistor.

3. The device of claim 2, where the first path further comprises a second path from the virtual ground to a second port of the first pair of ports, the second path comprising a second transistor, the second port coupled to a first gate of the first transistor, the first port coupled to a second gate of the second transistor.

4. The device of claim 3, where the first port is configured to drive, responsive to a signal at the first port, a response at the second port via the second gate of the second transistor.

5. The device of claim 1, where a first signal at a first port of the first pair of ports is configured to receive an inverted signal with respect to a second signal at a second port of the first pair of ports.

6. The device of claim 1, where the first pair of ports comprises a differential input port for the differential circuit.

7. The device of claim 1, where the differential circuit comprises a differential inductor comprising a differential input port.

8. The device of claim 7, where the differential inductor comprises:
   a first coil of a balun; and
   a second coil of the balun, inter-wound with the first coil.

9. The device of claim 8, where the balun is configured to convert a differential input signal at the differential input port to a single-ended signal at the second coil.

10. A method, comprising:
   detecting a voltage swing incident on a differential circuit, the differential circuit comprising a first pair of ports and a second pair of ports;
   determining when the voltage swing has crossed a signal level threshold, and in response:
      increasing an impedance across the first pair of ports by disengaging a first cross-coupled transconductance circuit (CCTC) across the first pair of ports; and
      decreasing an impedance across the second pair of ports by engaging a second CCTC across the second pair of ports.

11. The method of claim 10, where determining when the voltage swing has crossed a signal level threshold comprises determining that an amplitude of the voltage swing increased to a value above the signal level threshold.

12. The method of claim 10, where determining when the voltage swing has crossed a signal level threshold comprises determining that an amplitude of the voltage swing decreased to a value below the signal level threshold.

13. The method of claim 10, where engaging the second CCTC comprises engaging a finger transistor element within the CCTC.

14. The method of claim 10, where disengaging the first CCTC comprises opening a switch along path between a virtual ground and a transistor of the first CCTC.

15. The method of claim 10, where determining when the voltage swing has crossed a signal level threshold comprises:
receiving an indication of an amplification level of an amplifier producing the voltage swing; and
determining when the amplification level has crossed an amplification level threshold.

16. A device, comprising:
a differential inductor comprising:
a coil wound between a pair of differential ports configured to receive a differential signal;
a first virtual ground port connected to the coil at a point between the pair of differential ports;
a first pair of connection ports connected to the coil, the first pair of connections ports comprising a first resistance and first pair of connection ports configured to receive a first voltage swing responsive to the differential signal; and
a second pair of connection ports, between the first pair connection ports and the first virtual ground port, the second pair of connection ports comprising a second resistance and second pair of connection ports configured to receive a second voltage swing that is smaller than the first voltage swing;
a first cross-coupled transconductance circuit (CCTC) connected across the first pair of connection ports, the first CCTC configured to, when engaged, reduce the first resistance; and
a second CCTC connected across the second pair of connection ports, the second CCTC configured to, when engaged, reduce the second resistance;
circuitry, coupled to the first and second CCTCs, configured to:
determine if the differential signal has exceeded a signal level threshold;
responsive to the differential signal exceeding the signal level threshold, disengage the first CCTC; and
responsive to the differential signal exceeding the signal level threshold, engage the second CCTC.

17. The device of claim 16, where the first CCTC comprises:
a first path from a second virtual ground port to a first connection port of the first pair of connection ports, the first path comprising a first transistor; and
a second path from the second virtual ground port to a second connection port of the first pair of connection ports, the second path comprising a second transistor, the second connection port coupled to a first gate of the first transistor, the first connection port coupled to a second gate of the second transistor.

18. The device of claim 17, where a first switch is coupled along the first and second paths between the second virtual ground port and the first and second transistors; and
where the circuitry is further configured to disengage the first CCTC via operation of the first switch.

19. The device of claim 16, where the first CCTC is configured to, when engaged, generate a nonlinear response to voltage swings across the first pair of connection ports corresponding to differential signals that exceed the signal level threshold.

20. The device of claim 19, where the circuitry is configured to adjust a quality factor of the differential inductor by disengaging the first CCTC and engaging the second CCTC when the differential signal exceeds the signal level threshold.

* * * * *